United States Patent
Ishiwata

(10) Patent No.: US 12,045,477 B2
(45) Date of Patent: Jul. 23, 2024

(54) INFORMATION PROCESSING APPARATUS AND NON-TRANSITORY COMPUTER READABLE MEDIUM

(71) Applicant: FUJIFILM BUSINESS INNOVATION CORP., Tokyo (JP)

(72) Inventor: Masahiro Ishiwata, Kanagawa (JP)

(73) Assignee: FUJIFILM BUSINESS INNOVATION CORP., Tokyo (JP)

( * ) Notice: Subject to any disclaimer, the term of this patent is extended or adjusted under 35 U.S.C. 154(b) by 601 days.

(21) Appl. No.: 17/149,845

(22) Filed: Jan. 15, 2021

(65) Prior Publication Data
US 2022/0066666 A1    Mar. 3, 2022

(30) Foreign Application Priority Data

Aug. 31, 2020 (JP) .................................. 2020-145560

(51) Int. Cl.
*G06F 3/06* (2006.01)
*G06F 30/34* (2020.01)

(52) U.S. Cl.
CPC .......... *G06F 3/0632* (2013.01); *G06F 3/0604* (2013.01); *G06F 3/0673* (2013.01); *G06F 30/34* (2020.01)

(58) Field of Classification Search
CPC .. G06F 30/34; G06F 13/01694; G06F 3/0604; G06F 3/0632; H03K 19/0175; H03K 19/017581
See application file for complete search history.

(56) References Cited

U.S. PATENT DOCUMENTS

| 7,362,132 | B2 | 4/2008 | Imafuku | |
| 7,908,453 | B2* | 3/2011 | Kawano | G06F 15/7867 711/170 |
| 2004/0001296 | A1* | 1/2004 | Saito | G06F 15/7867 712/E9.035 |
| 2006/0004979 | A1* | 1/2006 | Kawano | G06F 12/0646 711/170 |
| 2006/0004991 | A1* | 1/2006 | Kawano | G06F 15/7867 712/226 |

(Continued)

FOREIGN PATENT DOCUMENTS

| JP | 2001-297006 A | 10/2001 |
| JP | 2006-018452 A | 1/2006 |

(Continued)

OTHER PUBLICATIONS

May 21, 2024 Office Action issued in Japanese Patent Application No. 2020-145560.

*Primary Examiner* — Jason M Crawford
(74) *Attorney, Agent, or Firm* — Oliff PLC

(57) ABSTRACT

An information processing apparatus includes a processor connected to a programmable logic circuit. The processor is configured to: upon initialization, reconfigure a first region of the programmable logic circuit as a first memory that stores data; reconfigure a second region different from the first region of the programmable logic circuit as a first arithmetic circuit that uses the first memory; and, in a case where the second region reconfigured as the first arithmetic circuit is reconfigured as a second arithmetic circuit different from the first arithmetic circuit, allow the second arithmetic circuit to use the first memory.

20 Claims, 9 Drawing Sheets

(56) References Cited

U.S. PATENT DOCUMENTS

| | | | | |
|---|---|---|---|---|
| 2010/0042751 A1* | 2/2010 | Ishino | G11C 7/10 | 710/8 |
| 2010/0174884 A1* | 7/2010 | Morishita | G06F 9/3885 | 712/15 |
| 2010/0332795 A1* | 12/2010 | Furukawa | G06F 9/34 | 711/E12.007 |
| 2015/0373225 A1* | 12/2015 | Tanaka | H04N 1/32609 | 358/474 |
| 2016/0162193 A1* | 6/2016 | Tanaka | G06F 3/0659 | 711/154 |
| 2022/0066666 A1* | 3/2022 | Ishiwata | G06F 30/34 | |
| 2022/0069823 A1* | 3/2022 | Sasaki | H03K 19/17758 | |
| 2022/0101897 A1* | 3/2022 | Shiokawa | G11C 7/1051 | |
| 2022/0138390 A1* | 5/2022 | Ono | G06F 30/347 | 716/117 |

FOREIGN PATENT DOCUMENTS

| | | |
|---|---|---|
| JP | 2007-026209 A | 2/2007 |
| JP | 2007-510325 A | 4/2007 |
| JP | 2007-157075 A | 6/2007 |
| JP | 2007-323164 A | 12/2007 |
| JP | 2010-213992 A | 9/2010 |
| JP | 2012-008715 A | 1/2012 |

* cited by examiner

INFORMATION PROCESSING APPARATUS AND NON-TRANSITORY COMPUTER READABLE MEDIUM

CROSS-REFERENCE TO RELATED APPLICATIONS

This application is based on and claims priority under 35 USC 119 from Japanese Patent Application No. 2020-145560 filed Aug. 31, 2020.

BACKGROUND

(i) Technical Field

The present disclosure relates to an information processing apparatus and a non-transitory computer readable medium.

(ii) Related Art

Japanese Unexamined Patent Application Publication No. 2007-157075 discloses an information storage device that, in response to detection of an error in a memory cell, reconfigures all connection lines connected to the memory cell so as to establish a connection with a control signal line connected to a memory cell for repair.

In addition, Japanese Unexamined Patent Application Publication No. 2006-18452 discloses a semiconductor device that reconfigures a memory region by dynamically changing the allocation of memory to a memory port in accordance with configuration information supplied from a control circuit that controls the state of the semiconductor device.

In addition, Japanese Unexamined Patent Application Publication No. 2007-323164 discloses a reconfigurable integrated circuit device in which it is unnecessary to provide, as a dedicated circuit, a memory initialization circuit that operates at the time of resetting.

In programmable logic circuits such as field-programmable gate arrays (FPGAs), processing is delayed as the time required for reconfiguration becomes longer. It is thus desirable that a to-be-reconfigured region be as small as possible.

SUMMARY

Aspects of non-limiting embodiments of the present disclosure relate to shortening the time required for reconfiguration, compared to the case in which, when a module realizing a function is reconfigured in a programmable logic circuit, the entire memory used by the module is also reconfigured.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided an information processing apparatus including a processor connected to a programmable logic circuit. The processor is configured to: upon initialization, reconfigure a first region of the programmable logic circuit as a first memory that stores data; reconfigure a second region different from the first region of the programmable logic circuit as a first arithmetic circuit that uses the first memory; and, in a case where the second region reconfigured as the first arithmetic circuit is reconfigured as a second arithmetic circuit different from the first arithmetic circuit, allow the second arithmetic circuit to use the first memory.

BRIEF DESCRIPTION OF THE DRAWINGS

An exemplary embodiment of the present disclosure will be described in detail based on the following figures, wherein.

DETAILED DESCRIPTION

Exemplary Embodiment

Configuration of Information Processing Apparatus

Figure 1:
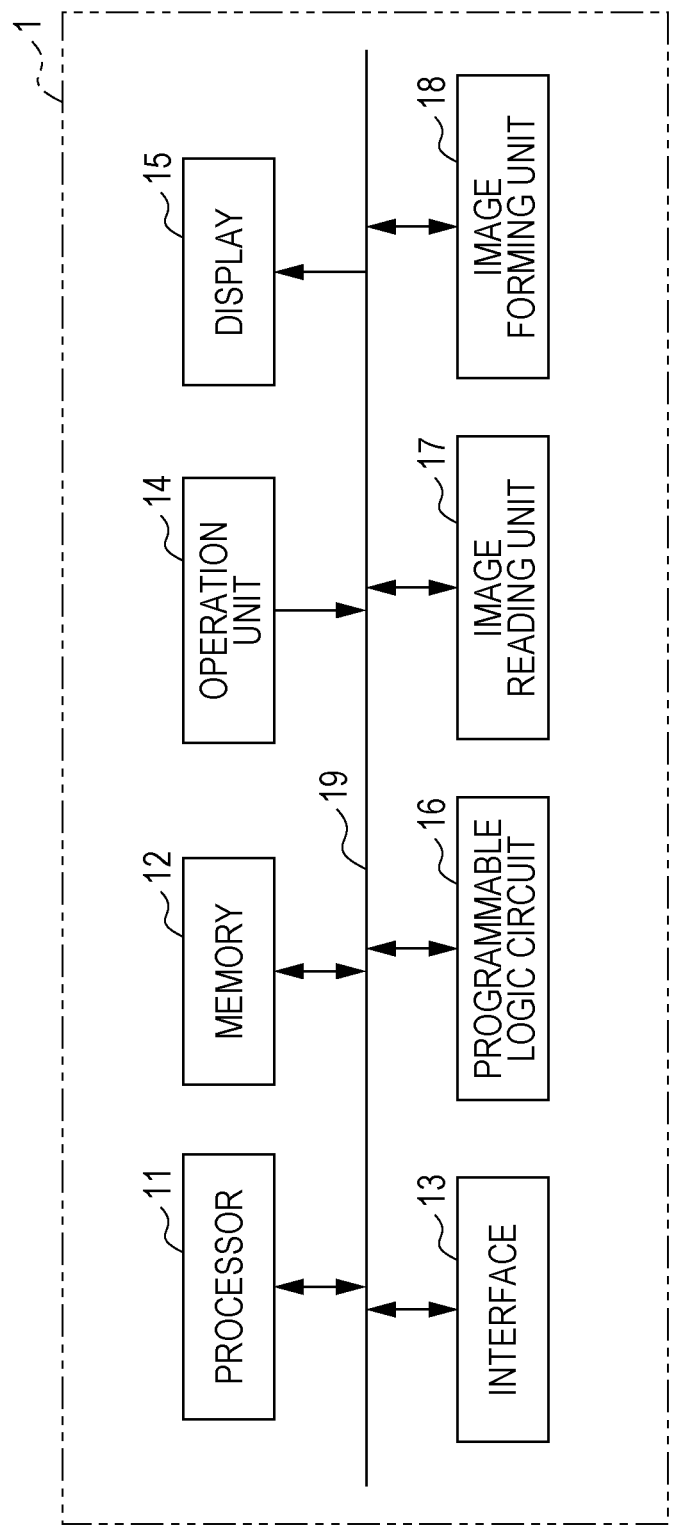
FIG. 1 is a diagram illustrating an example of the configuration of an information processing apparatus.

FIG. 1 is a diagram illustrating an example of the configuration of an information processing apparatus 1. The information processing apparatus 1 illustrated in FIG. 1 includes a processor 11, a memory 12, an interface 13, an operation unit 14, a display 15, a programmable logic circuit 16, an image reading unit 17, and an image forming unit 18. These configurations are connected by a bus 19 so that they may be able to communicate with each other.

The bus 19 includes a host bus for connecting the processor 11 to a chipset (not illustrated), and a memory bus for connecting a memory controller (not illustrated) included in the chipset and the memory 12. In addition, the bus 19 includes a peripheral component interconnect (PCI) bus for connecting the processor 11 to the programmable logic circuit 16 and the like, and a host PCI bus bridge for connecting the PCI bus and the above-mentioned host bus. In addition, the bus 19 may also include an image bus for exchanging image data, which is used by the image reading unit 17 and the image forming unit 18.

The processor 11 controls each unit of the information processing apparatus 1 by reading and executing a program stored in the memory 12. The processor 11 is, for example, a central processing unit (CPU).

The memory 12 is storage that stores an operating system, various programs, data, and the like that are loaded to the processor 11. In addition, the memory 12 stores data of circuit information (may also be referred to as configuration data) to be written to the programmable logic circuit 16.

The memory 12 includes random-access memory (RAM) and read-only memory (ROM). Note that the memory 12 may also include a solid-state drive or a hard disk drive.

The interface 13 is a communication circuit that communicatively connects the information processing apparatus 1 to another apparatus via wire or wirelessly. For example, the interface 13 connects various devices to the processor 11 and allows the processor 11 to control these devices.

The operation unit 14 includes operators such as operation buttons, a keyboard, a mouse, and a touchscreen for giving various commands. The operation unit 14 receives an operation and sends a signal in accordance with the operation content thereof to the processor 11.

The display 15 displays a specified image under control of the processor 11 or the programmable logic circuit 16. The display 15 illustrated in FIG. 1 includes a liquid crystal display, which is a display screen for displaying the above-mentioned image. A transparent touchscreen of the operation unit 14 may be arranged on the liquid crystal display in an overlapping manner.

The image reading unit 17 includes an irradiator such as a light-emitting diode (LED), an optical system such as a lens and a prism, and an imaging element such as a complementary metal oxide semiconductor (CMOS) image sensor or a charge-coupled device (CCD) image sensor. Under control of the processor 11 or the programmable logic circuit 16, the image reading unit 17 reads an image formed on a medium such as paper, generates image data indicating the read image, and supplies the image data to the processor 11.

Under control of the processor 11 or the programmable logic circuit 16, the image forming unit 18 forms an image on a medium such as paper using, for example, electrophotography.

The programmable logic circuit 16 is a logic circuit where a module realizing a function is reconfigurable under control of the processor 11, and is, for example, a field programmable gate array (FPGA). The programmable logic circuit 16 illustrated in FIG. 1 controls at least one of the display 15, the image reading unit 17, and the image forming unit 18. Note that the targets controlled by the programmable logic circuit 16 are not limited to the foregoing units. In addition, the programmable logic circuit 16 need not control these units.

Figure 2:
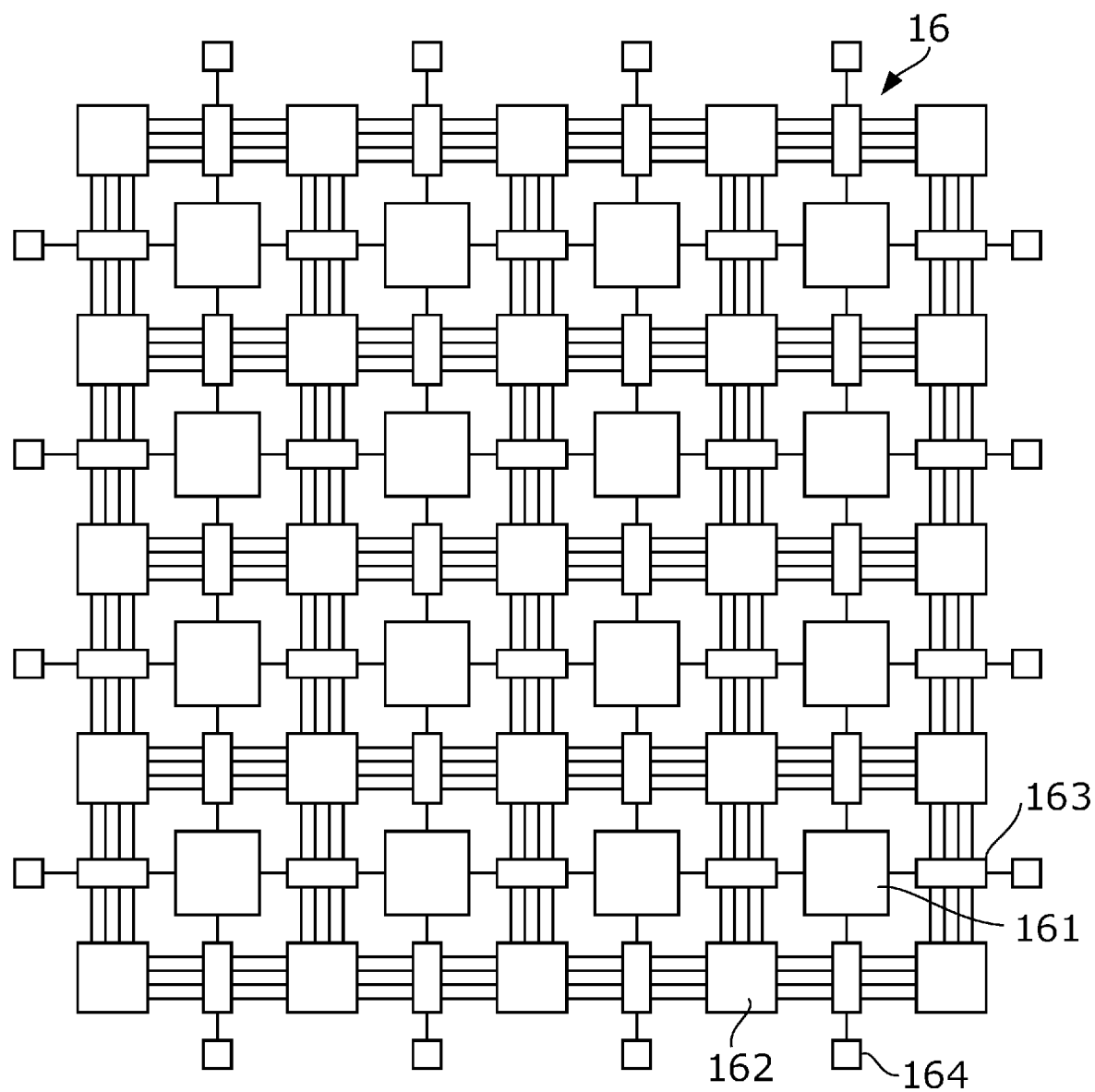
FIG. 2 is a diagram illustrating an example of the configuration of a programmable logic circuit according to an exemplary embodiment.

FIG. 2 is a diagram illustrating an example of the configuration of the programmable logic circuit 16 according to the present exemplary embodiment. The programmable logic circuit 16 illustrated in FIG. 2 is a so-called island-style FPGA.

The programmable logic circuit 16 includes a plurality of logic blocks 161, switch blocks 162, connection blocks 163, and input/output terminals 164, which are respectively arranged in a grid pattern. That is, the programmable logic circuit 16 is an example of a programmable logic circuit including a plurality of logic blocks arranged in a grid pattern. Note that the programmable logic circuit 16 illustrated in FIG. 2 is only schematically illustrated, and the numbers of logic blocks 161 and so forth are not limited to those illustrated in FIG. 2.

The logic blocks 161 are blocks that serve as units for configuring modules for realizing various functions, such as logic and arithmetic circuits, memory circuits, and so forth using truth table circuits or the like.

The switch blocks 162 and the connection blocks 163 constitute a wiring region, along with wires connecting these blocks.

The switch blocks 162 are blocks for switching connections between wires. The connection blocks 163 are blocks for switching connections between the input/output of the logic blocks 161 and the above-mentioned wiring region.

The switch blocks 162 and the connection blocks 163 include, for example, switches using bus transistors, and configuration memories for controlling the switches.

The input/output terminals 164 are blocks that communicatively connect the programmable logic circuit 16 and the processor 11 and that serve as an interface for an input from the processor 11 and an output to the processor 11. The input/output terminals 164 illustrated in FIG. 2 are connected to the above-mentioned wiring region.

Note that the programmable logic circuit 16 may include, for example, a digital signal processor (DSP) used for executing a predetermined process.

The processor 11 reconfigures the programmable logic circuit 16 by writing configuration data stored in the memory 12 respectively to the logic blocks 161, the switch blocks 162, and the connection blocks 163 of the programmable logic circuit 16.

Functional Configuration of Information Processing Apparatus

Figure 3:
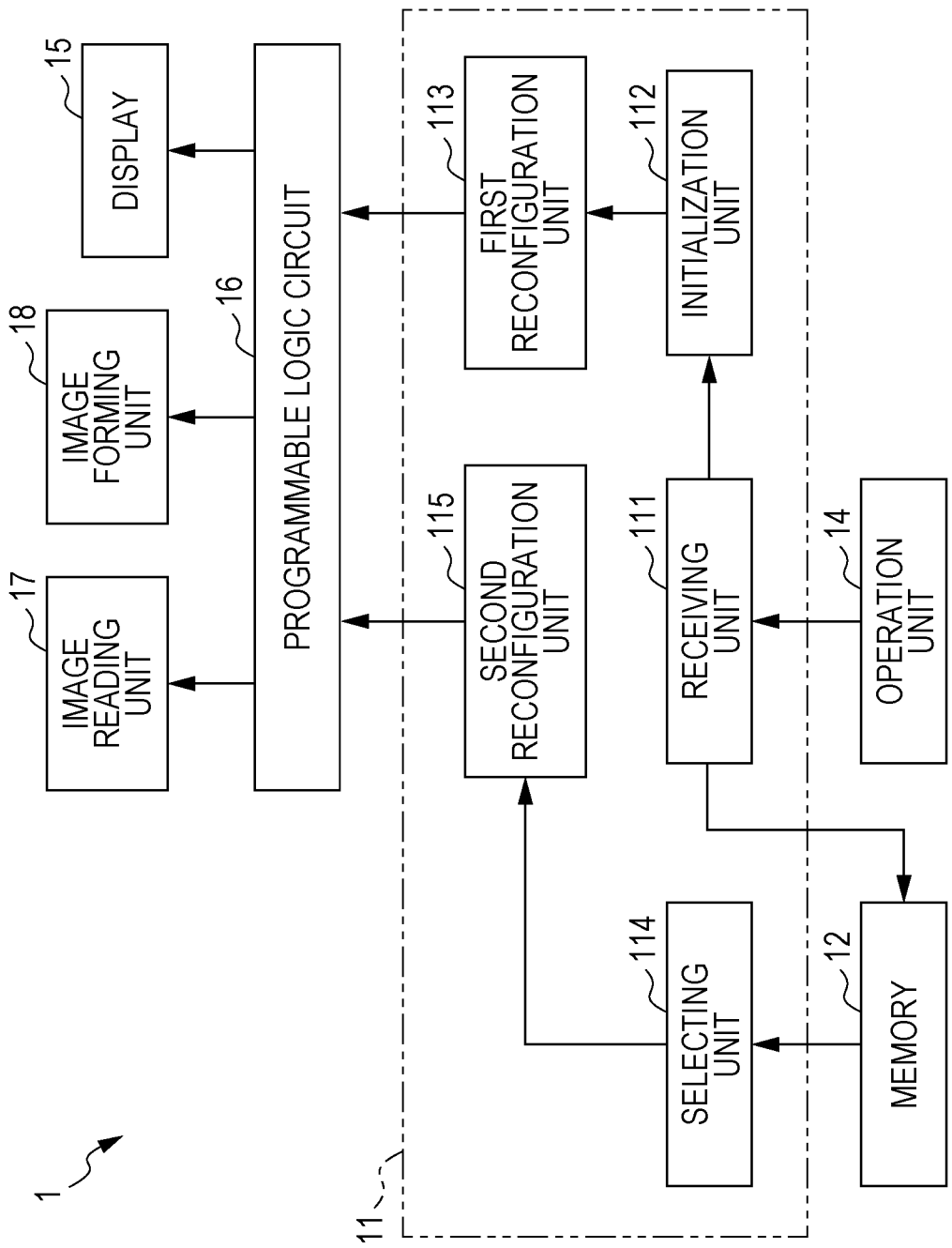
FIG. 3 is a diagram illustrating an example of the functional configuration of the information processing apparatus.

FIG. 3 is a diagram illustrating an example of the functional configuration of the information processing apparatus 1. The processor 11 of the information processing apparatus 1 executes a program stored in the memory 12, thereby functioning as a receiving unit 111, an initialization unit 112, a first reconfiguration unit 113, a selecting unit 114, and a second reconfiguration unit 115.

The receiving unit 111 receives a user command from the operation unit 14. On receipt of, for example, a command to activate the information processing apparatus 1 (referred to as an activation command), the receiving unit 111 starts feeding power from a power supply (not illustrated) to activate the information processing apparatus 1.

The receiving unit 111 also receives commands to execute various types of arithmetic processing (referred to as processing commands). These various types of arithmetic processing are arithmetic processing on image data, such as edge enhancement processing including the Sobel filter and the Laplacian filter, and tone correction processing based on a tone reproduction curve (TRC). On receipt of processing commands mentioned above, the receiving unit 111 sequentially stores items of identification information of arithmetic processing indicated by the processing commands in a predetermined region of the memory 12 to generate a queue.

In the case where the receiving unit 111 receives, for example, an activation command mentioned above, the initialization unit 112 checks whether the programmable logic circuit 16 is before initialization. In the case where it is determined that the programmable logic circuit 16 is before initialization, the initialization unit 112 initializes the programmable logic circuit 16.

The stored contents of a storage element such as a configuration memory included in the programmable logic circuit 16 are erased when the feeding of power is stopped. Upon completion of initialization, the initialization unit 112 stores information such as a flag indicating the completion of initialization in the storage element. This information is continuously stored as long as the feeding of power is maintained. Thus, the initialization unit 112 recognizes that the programmable logic circuit 16 has already been initialized (that is, the programmable logic circuit 16 is not before initialization).

When the initialization unit 112 performs initialization, the first reconfiguration unit 113 reconfigures a predetermined region (hereinafter referred to as a first region) of the programmable logic circuit 16 as a memory that stores data (hereinafter referred to as a first memory).

The first region is included in a so-called static region, which is reconfigured only upon initialization. In addition, upon initialization, the first reconfiguration unit 113 also reconfigures functions to reside in the programmable logic circuit 16, such as an interface with the PCI bus, an interface with the input/output terminals 164 of the programmable logic circuit 16, and an interface with the image bus, in the static region.

The selecting unit 114 selects, from the queue generated by the receiving unit 111 in the memory 12, any one item of identification information on the basis of priority, for example. The selecting unit 114 selects, from the memory 12, configuration data which is information on a circuit (referred to as an arithmetic circuit) for executing arithmetic processing indicated by the selected identification information, and supplies the configuration data to the second reconfiguration unit 115.

The second reconfiguration unit 115 writes the configuration data, supplied from the selecting unit 114, to a region (referred to as a second region) different from the first region of the programmable logic circuit 16, and reconfigures the above-mentioned arithmetic circuit in the second region.

The second region is a region, of a so-called reconfiguration region, for reconfiguring an arithmetic circuit. The reconfiguration region is reconfigured whenever it becomes necessary, not only upon initialization. The arithmetic circuit reconfigured in the second region executes the above-mentioned arithmetic processing using the above-mentioned first memory. Using the reconfigured arithmetic circuit, the programmable logic circuit 16 may control any of the display 15, the image reading unit 17, and the image forming unit 18 to output the result of the arithmetic processing.

In addition, the second reconfiguration unit 115 monitors the second region of the programmable logic circuit 16. In the case where an arithmetic circuit indicated by identification information selected by the selecting unit 114 has not been reconfigured in the second region, a new arithmetic circuit (referred to as a second arithmetic circuit) is reconfigured so as to overwrite an arithmetic circuit (referred to as a first arithmetic circuit) that has already been reconfigured, has completed execution of arithmetic processing, and has become unnecessary. The second arithmetic circuit, which is different from the first arithmetic circuit, also uses the first memory when executing arithmetic processing.

Operation of Information Processing Apparatus

The processor 11 of the information processing apparatus 1 reads a program stored in the memory 12 to execute a command receiving operation of receiving a command, and an arithmetic processing operation of reconfiguring an arithmetic circuit in the programmable logic circuit 16 and allowing the arithmetic circuit to perform arithmetic processing.

Command Receiving Operation

Figure 4:
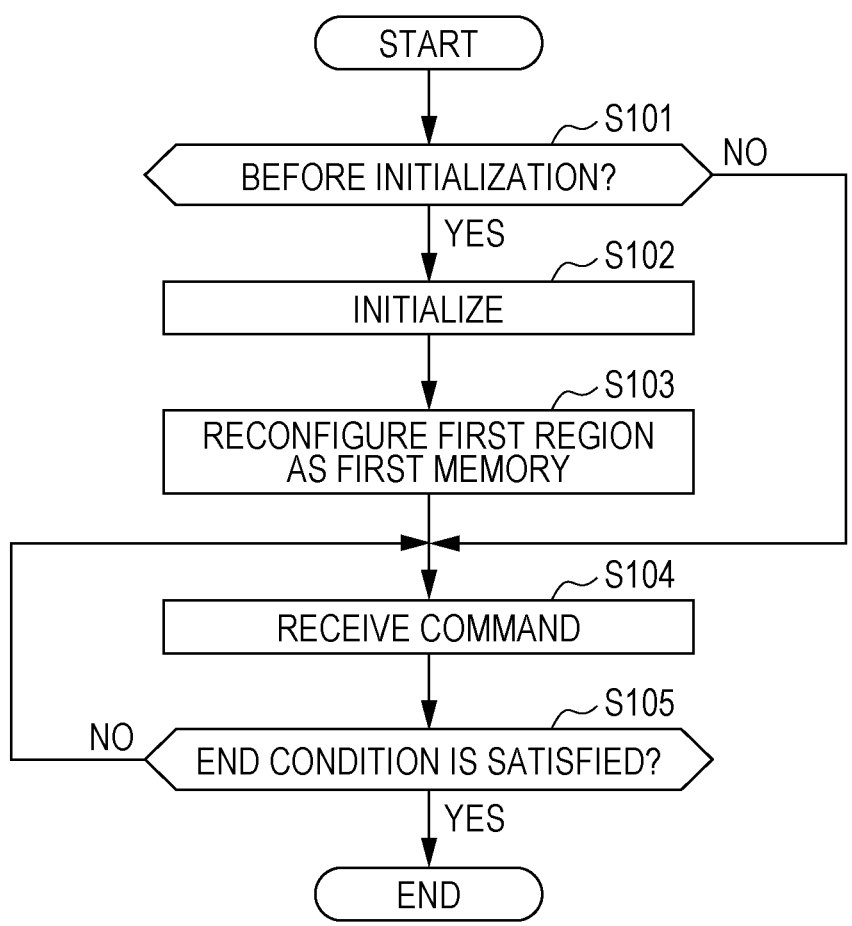
FIG. 4 is a flowchart illustrating an example of a command receiving operation of the information processing apparatus.

FIG. 4 is a flowchart illustrating an example of a command receiving operation of the information processing apparatus 1. The processor 11 of the information processing apparatus 1 determines whether the programmable logic circuit 16 is before initialization (step S101). In the case where it is determined that the programmable logic circuit 16 is before initialization (YES in step S101), the processor 11 initializes the programmable logic circuit 16 (step S102). Along with this initialization, the processor 11 reconfigures the first region as a first memory (step S103).

In contrast, in the case where it is determined that the programmable logic circuit 16 is not before initialization (NO in step S101), the processor 11 brings the process forward to step S104 without performing steps S102 and S103 described above.

The processor 11 receives processing commands (step S104). Items of identification information of arithmetic processing indicated by the received processing commands are accumulated in the memory 12 to generate a queue.

The processor 11 determines whether the information processing apparatus 1 satisfies an end condition (step S105). The end condition is, for example, the condition that the operation unit 14 receives an operation from the user to give a command to shut down the information processing apparatus 1, or the condition that no processing has been executed for a predetermined period.

In the case where it is determined that the end condition is satisfied (YES in step S105), the processor 11 ends the process. In contrast, in the case where it is determined that the end condition is not satisfied (NO in step S105), the processor 11 brings the process back to step S104.

In this case, the processor 11 reconfigures the first region only upon initialization. In other words, the processor 11 is an example of a processor that does not reconfigure the first region except for upon initialization of the programmable logic circuit. Because the first memory reconfigured upon initialization is configured to be readable and writable, the stored contents are rewritten every time, not only upon initialization. As long as the feeding of power continues, the first memory is not reconfigured to another circuit or the like.

Operation of Arithmetic Processing

Figure 5:
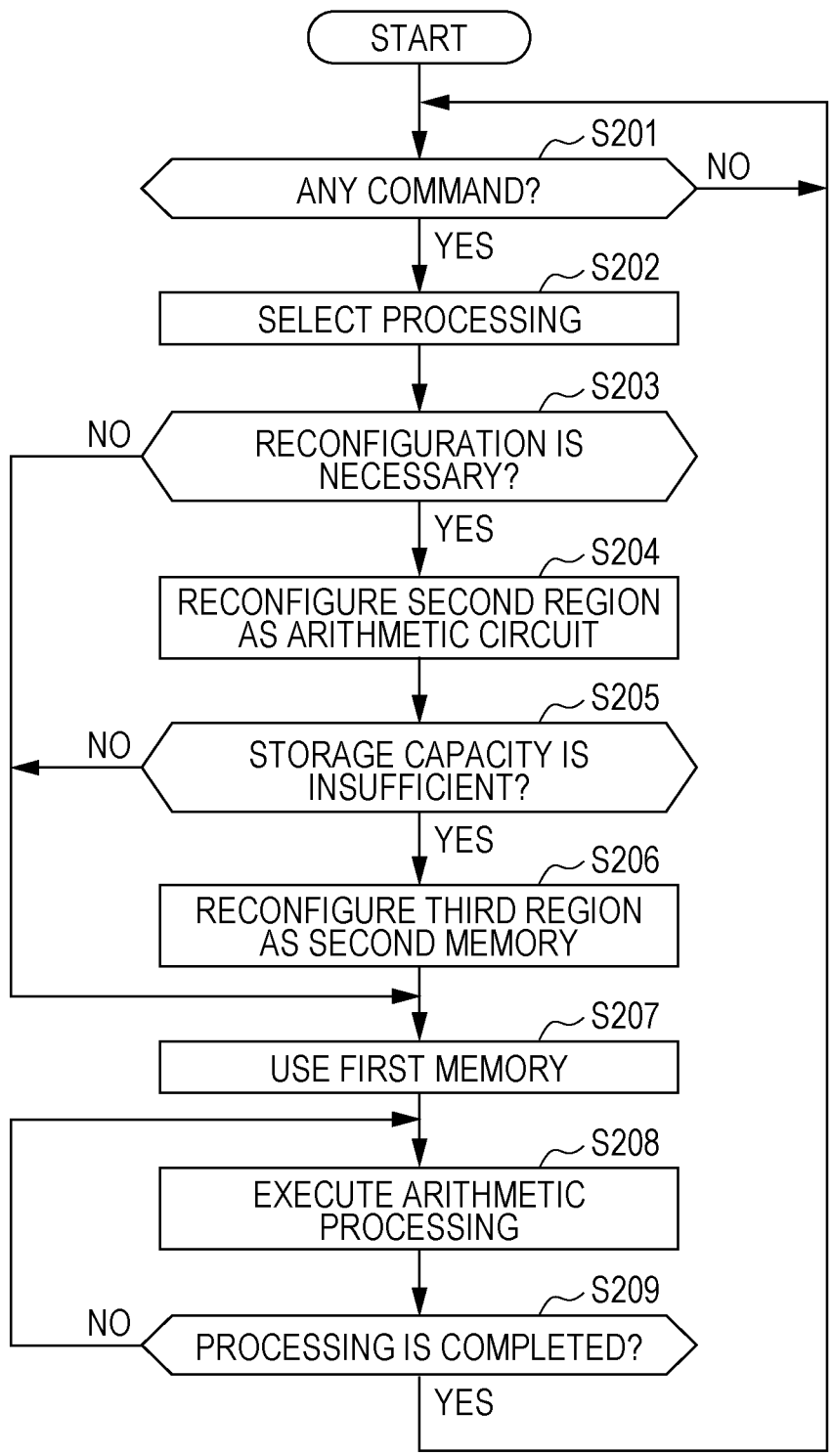
FIG. 5 is a flowchart illustrating an example of an arithmetic processing operation of the information processing apparatus.

FIG. 5 is a flowchart illustrating an example of an arithmetic processing operation of the information processing apparatus 1. The arithmetic processing operation starts, for example, in parallel after the initialization in step S102 is completed in the command receiving operation illustrated in FIG. 4.

The processor 11 of the information processing apparatus 1 reads the queue generated in the memory 12 and determines whether there is any processing command (step S201). In the case where it is determined that there is no processing command (NO in step S201), the processor 11 repeats this determination.

In contrast, in the case where it is determined that there is a processing command (YES in step S201), the processor 11 selects any processing command from the queue (step S202), and determines whether it is necessary to reconfigure the programmable logic circuit 16 for processing indicated by the processing command (step S203). In the case where it is determined that reconfiguration is unnecessary (NO in step S203), the processor 11 brings the process forward to S207.

In contrast, in the case where it is determined that reconfiguration is necessary (YES in step S203), the processor 11 reconfigures the above-mentioned second region as an arithmetic circuit indicated by the processing command (step S204). Note that the processor 11 may set the default settings of the first memory reconfigured in the first region in a period in which the second region is being reconfigured as an arithmetic circuit.

Next, the processor 11 determines whether the storage capacity of the first memory used by the arithmetic circuit reconfigured in step S204 is insufficient (step S205). In the case where it is determined that the storage capacity is not insufficient (NO in step S205), the processor 11 brings the process forward to S207.

In contrast, in the case where it is determined that the storage capacity is insufficient (YES in step S205), the processor 11 reconfigures a region (referred to as a third region) different from both of the first region and the second region as a second memory that supplements the first memory for the above-mentioned arithmetic circuit (step S206).

In other words, the processor 11 is an example of a processor that, when the second region is reconfigured as the first arithmetic circuit, if a storage capacity of the first memory used by the first arithmetic circuit is insufficient, reconfigures a third region of the programmable logic circuit as a second memory that supplements the storage capacity.

The processor 11 allows the arithmetic circuit reconfigured in the second region to use the first memory (step S207), and allows the arithmetic circuit to execute arithmetic processing (step S208). The processor 11 determines whether the arithmetic processing executed by the above-mentioned arithmetic circuit of the programmable logic circuit 16 is completed (step S209). In the case where it is determined that the arithmetic processing is completed (YES in step S209), the processor 11 brings the process back to step S201. In contrast, in the case where it is determined that the arithmetic processing is not completed (NO in step S209), the processor 11 brings the process back to step S208, and allows the programmable logic circuit 16 to continue with the arithmetic processing.

Figure 6:
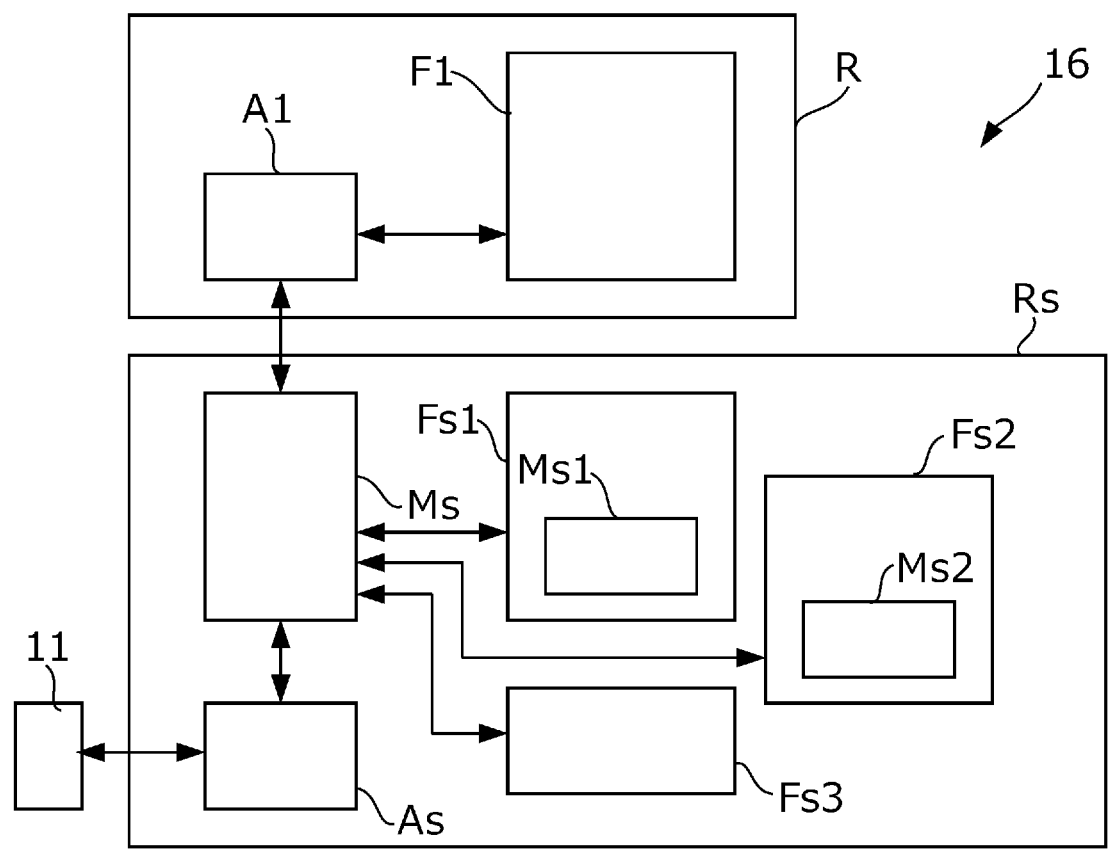
FIG. 6 is a diagram for describing the reconfiguration state of the programmable logic circuit.

FIG. 6 is a diagram for describing the reconfiguration state of the programmable logic circuit 16. The programmable logic circuit 16 illustrated in FIG. 6 includes a static region Rs and a reconfiguration region R.

The static region Rs is a region that is reconfigured only once upon initialization. In the static region Rs, resident circuits Fs1, Fs2, and Fs3 are reconfigured. These resident circuits Fs1, Fs2, and Fs3 are circuits that realize functions to be resident in the programmable logic circuit 16. These resident circuits realize the functions of, for example, interfaces with the above-mentioned PCI bus, the input/output terminals 164, and the image bus, and arithmetic processing on image data that is relatively frequently called.

In addition, a first memory Ms, which is a storage region used by the resident circuits Fs1, Fs2, and Fs3, is reconfigured in the static region Rs. The first memory Ms is also used by an arithmetic circuit reconfigured in the later-described reconfiguration region R. Of the static region Rs, a region where the first memory Ms is reconfigured is a first region. The first memory Ms is reconfigured as, for example, dual-ported RAM (DPRAM) that permits multiple reads and/or writes at the same time.

The resident circuit Fs1 and the resident circuit Fs2 include dedicated memory Ms1 and Ms2, respectively. The resident circuit Fs3 includes no dedicated memory.

In addition, a control circuit As is reconfigured in the static region Rs. The control circuit As controls access from the processor 11 to the first memory Ms.

The reconfiguration region R is a region that is reconfigured whenever a function is realized. In the reconfiguration region R, a first arithmetic circuit F1 is reconfigured. Of the reconfiguration region R, a region where the first arithmetic circuit is reconfigured is a second region.

In the reconfiguration region R, a control circuit may be reconfigured so as to allow the arithmetic circuit to use the first memory Ms, which is reconfigured in the static region Rs upon initialization. In the reconfiguration region R illustrated in FIG. 6, a control circuit A1 is reconfigured in a region (referred to as a fourth region) different from the second region. The control circuit A1 controls access from the first arithmetic circuit F1 to the first memory Ms. This allows the first arithmetic circuit F1 to use the first memory Ms.

In other words, the processor 11 is an example of a processor that, when the second region is reconfigured as the first arithmetic circuit, reconfigures a fourth region of the programmable logic circuit as a control circuit that controls access from the first arithmetic circuit to the first memory.

Figure 7:
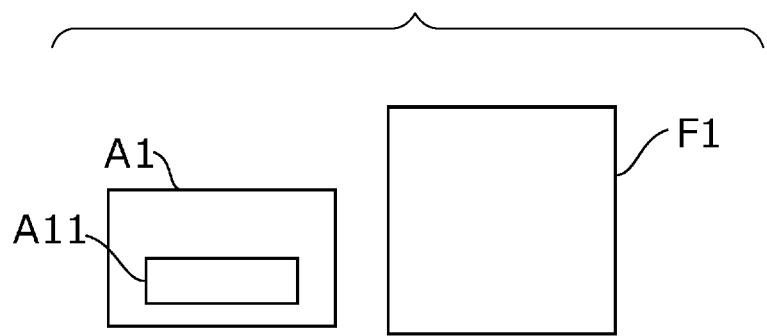
FIG. 7 is a diagram illustrating an example of an arithmetic circuit including no dedicated memory.

FIG. 7 is a diagram illustrating an example of an arithmetic circuit including no dedicated memory. As illustrated in FIG. 7, the first arithmetic circuit F1 includes no dedicated memory. The control circuit A1 reconfigured, along with the first arithmetic circuit F1, in the fourth region of the reconfiguration region R illustrated in FIG. 6 includes a static memory control circuit A11, as illustrated in FIG. 7. The static memory control circuit A11 is a circuit that controls access from the first arithmetic circuit F1 to the first memory Ms reconfigured in the first region of the static region Rs.

The first arithmetic circuit F1 gives the control circuit A1 a request to access the first memory Ms. The control circuit A1 responds to the request from the first arithmetic circuit F1 using the static memory control circuit A11.

Figure 8:
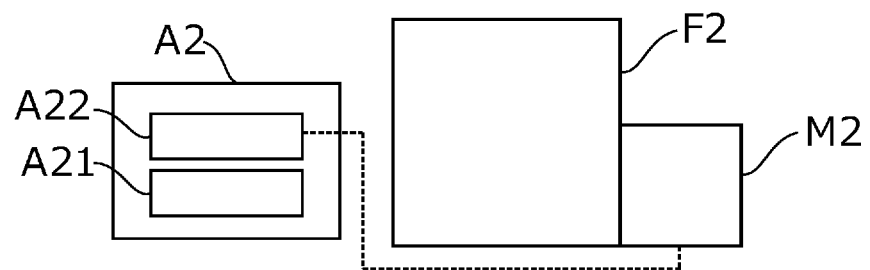
FIG. 8 is a diagram illustrating an example of an arithmetic circuit including a dedicated memory.

FIG. 8 is a diagram illustrating an example of an arithmetic circuit including dedicated memory. After the first arithmetic circuit F1 completes execution of arithmetic processing and becomes unnecessary, in response to a command from a user to execute arithmetic processing different from the arithmetic processing executed by the first arithmetic circuit F1, the processor 11 determines that it has become necessary to perform reconfiguration.

In this case, the processor 11 reads configuration data indicating information on an arithmetic circuit that executes the commanded arithmetic processing. The processor 11 overwrites the second region where the first arithmetic circuit F1 has been reconfigured with this configuration data, and reconfigures a second arithmetic circuit F2 in the second region.

In the case where the storage capacity of the first memory Ms is insufficient for memory used by the second arithmetic circuit F2, the processor 11 reconfigures a second memory M2 in addition to the second arithmetic circuit F2. The second memory M2 is a memory that is exclusively used by the second arithmetic circuit F2, and that supplements the storage capacity of the first memory Ms. Of the reconfiguration region R, a region where the second memory M2 is reconfigured is a third region.

In this case, as illustrated in FIG. 8, a control circuit A2 is reconfigured, along with the second arithmetic circuit F2. The control circuit A2 includes a static memory control circuit A21 and a reconfiguration memory control circuit A22. The static memory control circuit A21 is a circuit that controls access from the second arithmetic circuit F2 to the first memory Ms reconfigured in the first region of the static region Rs.

In contrast, the reconfiguration memory control circuit A22 is a circuit that controls access from the second arithmetic circuit F2 to the second memory M2 reconfigured in the third region of the reconfiguration region R.

When the second arithmetic circuit F2 gives the control circuit A2 a request to access the first memory Ms, the control circuit A2 responds to the request from the second arithmetic circuit F2 using the static memory control circuit A21.

In contrast, when the second arithmetic circuit F2 gives the control circuit A2 a request to access the second memory M2, the control circuit A2 responds to the request from the second arithmetic circuit F2 using the reconfiguration memory control circuit A22. In other words, the control circuit A2 switches control depending on the location of memory requested by the second arithmetic circuit F2 to access.

Although the first arithmetic circuit F1 and the second arithmetic circuit F2 are distinguished by the order of reconfiguration, they are common as arithmetic circuits. In the case where the storage capacity of the first memory Ms used by the first arithmetic circuit F1 is insufficient, the processor 11 may reconfigure a memory (that is, a second memory) dedicated to the first arithmetic circuit F1.

In other words, the processor 11 is an example of a processor that, when the second region is reconfigured as the first arithmetic circuit, if a storage capacity of the first memory used by the first arithmetic circuit is insufficient, reconfigures a third region of the programmable logic circuit as a second memory that supplements the storage capacity.

Also, in this case, along with reconfiguration of the first arithmetic circuit F1 and a memory dedicated to the first arithmetic circuit F1, the processor 11 reconfigures the control circuit A1 in the fourth region of the reconfiguration region R. The control circuit A1 may include a reconfiguration memory control circuit in addition to the static memory control circuit A11.

This reconfiguration memory control circuit controls access from the first arithmetic circuit F1 to the memory dedicated to the first arithmetic circuit F1. In other words, the processor 11 is an example of a processor that reconfigures a fourth region of the programmable logic circuit as a control circuit that controls access from the first arithmetic circuit to each of the first memory and the second memory.

Figure 9:
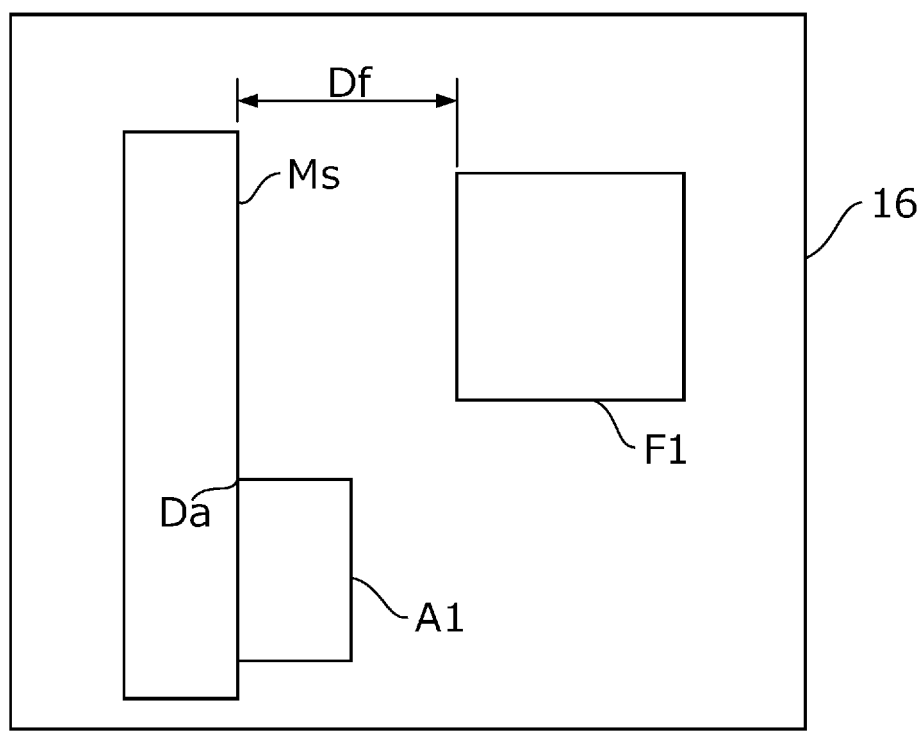
FIG. 9 is a diagram illustrating an example of the arrangement of a first memory, a first arithmetic circuit, and a first control circuit.

FIG. 9 is a diagram illustrating an example of the arrangement of the first memory Ms, the first arithmetic circuit F1, and the control circuit A1. The programmable logic circuit 16 has a configuration in which elements such as the logic blocks 161 are arranged in a grid pattern, as illustrated in FIG. 2. The arrangement of each of the first memory Ms, the first arithmetic circuit F1, and the control circuit A1 illustrated in FIG. 9 is the physical arrangement of each of them in a corresponding region of the programmable logic circuit 16.

As illustrated in FIG. 9, the first memory Ms and the first arithmetic circuit F1 are separated by a distance Df. In contrast, the first memory Ms and the control circuit A1 are separated by a distance Da. The distance Da is shorter than the distance Df. In other words, the distance Da, which is between the fourth region where the control circuit A1 is reconfigured and the first region where the first memory Ms is reconfigured, is less than the distance Df, which is between the second region where the first arithmetic circuit F1 is reconfigured and the first region (Da<Df). With this configuration, a path connecting the control circuit A1 and the first memory Ms is shorter than a path connecting the control circuit A1 and the first arithmetic circuit F1, thereby improving the wiring efficiency.

Note that the distance Da illustrated in FIG. 9 is the minimum distance, and two configurations separated by the distance Da are adjacent to each other. In other words, in the arrangement illustrated in FIG. 9, the fourth region where the control circuit A1 is reconfigured is adjacent to the first region where the first memory Ms is reconfigured. With this configuration, the path connecting the control circuit A1 and the first memory Ms is shortest, thereby improving the wiring efficiency.

Figure 10:
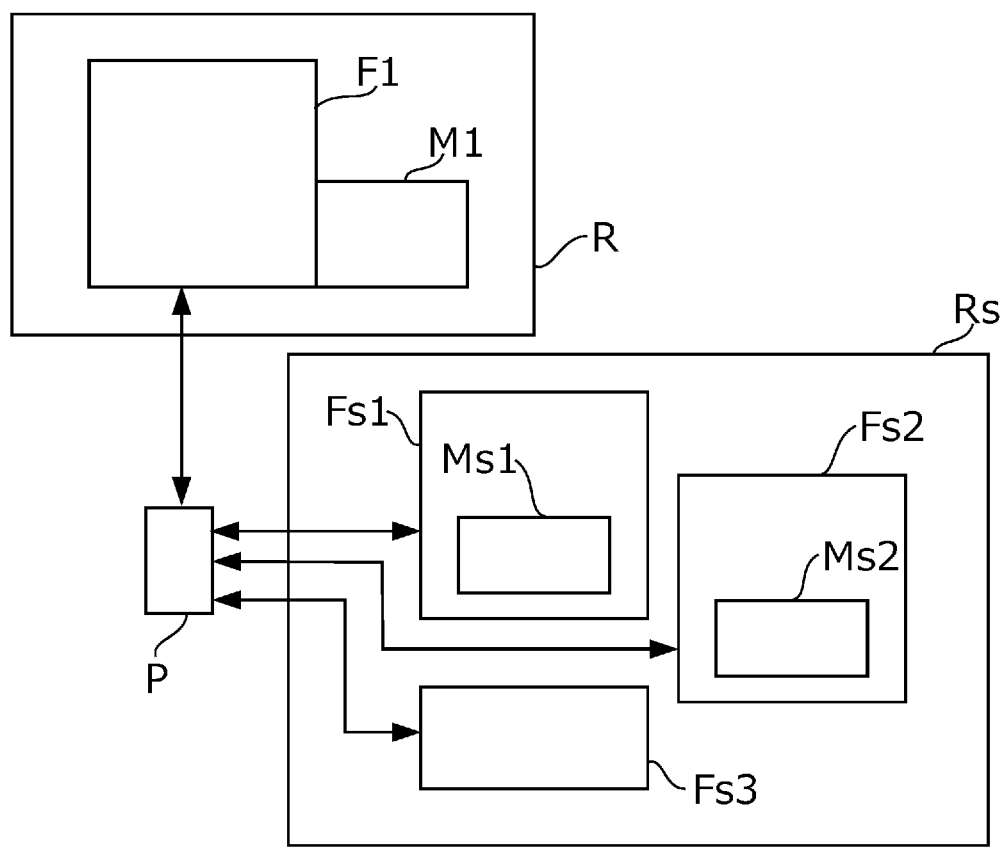
FIG. 10 is a diagram illustrating an example of a programmable logic circuit of the related art.

FIG. 10 is a diagram illustrating an example of a programmable logic circuit of the related art. In the related art, a processor P reconfigures a static region Rs and a reconfiguration region R of the programmable logic circuit, as illustrated in FIG. 10. That is, the processor P reconfigures a first arithmetic circuit F1, which is a module that realizes a function, and a dedicated memory M1, which is entire memory used by the first arithmetic circuit F1, in the reconfiguration region R. The processor P reconfigures resident circuits Fs1, Fs2, and Fs3 in the static region Rs.

In this case, all the contents that are written and/or read by the first arithmetic circuit F1 are required to be stored entirely in the dedicated memory M1. Accordingly, the storage capacity of the dedicated memory M1 strains the reconfiguration region R. In addition, in order for the processor P to activate the first arithmetic circuit F1 reconfigured in the programmable logic circuit, it also takes time to reconfigure the dedicated memory M1, which has a relatively large size.

With the above-described operation, because the information processing apparatus 1 allows an arithmetic circuit reconfigured in the programmable logic circuit 16 to use a first memory reconfigured in the static region Rs, it is unnecessary to store all the stored contents used by the arithmetic circuit in a memory dedicated to the arithmetic circuit. Therefore, the information processing apparatus 1 may suppress a to-be-reconfigured memory when reconfiguring an arithmetic circuit, thereby shortening the time required for reconfiguration.

In other words, the time required for reconfiguration by the information processing apparatus 1 is shorter than that in the case where, when a module realizing a function is reconfigured in a programmable logic circuit, entire memory used by the module is also reconfigured.

Modifications

So far is the description of the exemplary embodiment; now, the content of the exemplary embodiment may be modified as follows. In addition, the following modifications may be combined with one another.

First Modification

Although the information processing apparatus 1 includes the processor 11 including a CPU in the above-described exemplary embodiment, a controller that controls the information processing apparatus 1 may be other configurations. For example, the information processing apparatus 1 may include various processors other than a CPU.

In the embodiments above, the term "processor" refers to hardware in a broad sense. Examples of the processor include general processors (e.g., CPU: Central Processing Unit) and dedicated processors (e.g., GPU: Graphics Processing Unit, ASIC: Application Specific Integrated Circuit, FPGA: Field Programmable Gate Array, and programmable logic device).

Second Modification

In the embodiments above, the term "processor" is broad enough to encompass one processor or plural processors in collaboration which are located physically apart from each other but may work cooperatively.

The order of operations of the processor is not limited to one described in the embodiments above, and may be changed.

Third Modification

Although the shape of the second region is not particularly limited in the above-described exemplary embodiment, it is preferable that the second region be rectangular. In addition, the second region may have a shape combining a plurality of rectangles. When the second region has a shape combining a plurality of rectangles, the wiring efficiency and resources utilization are improved, compared to the case where the second region has a single rectangular shape.

Fourth Modification

Although the width of the first region is not particularly limited in the above-described exemplary embodiment, it is preferable that the first region have a predetermined unified width. When the first region has a predetermined unified width, a first memory reconfigured in the first region upon initialization becomes accessible to each unified interface when the first memory is shared and used by different arithmetic circuits. Instead of adjusting the width of the first region itself to the above-mentioned interface, for example, the difference between the width of the first memory required by the above-mentioned interface and the actual width of the first memory may be absorbed by a wrapper circuit surrounding the first region.

Fifth Modification

In the above-described exemplary embodiment, a program executed by the processor 11 of the information processing apparatus 1 is an example of a program that causes a computer including a processor connected to a programmable logic circuit to execute a process including: upon initialization, reconfigure a first region of the programmable logic circuit as a first memory that stores data; reconfigure a second region different from the first region of the programmable logic circuit as a first arithmetic circuit that uses the first memory; and, in a case where the second region reconfigured as the first arithmetic circuit is reconfigured as a second arithmetic circuit different from the first arithmetic circuit, allow the second arithmetic circuit to use the first memory.

The program may be provided in a state where the program is recorded on a computer-readable recording medium such as a magnetic recording medium including a magnetic tape and a magnetic disk, an optical recording medium including an optical disk, a magneto-optical recording medium, and semiconductor memory. In addition, the program may be downloaded via a communication line such as the Internet.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. An information processing apparatus comprising:
a processor connected to a programmable logic circuit, the processor being configured to:
upon initialization, reconfigure a first region of the programmable logic circuit as a first memory that stores data;
reconfigure a second region different from the first region of the programmable logic circuit as a first arithmetic circuit that uses the first memory; and
in a case where the second region reconfigured as the first arithmetic circuit is reconfigured as a second arithmetic circuit different from the first arithmetic circuit, allow the second arithmetic circuit to use the first memory.

2. The information processing apparatus according to claim 1, wherein the processor is configured not to reconfigure the first region except for upon the initialization of the programmable logic circuit.

3. The information processing apparatus according to claim 2, wherein the processor is configured to, when the second region is reconfigured as the first arithmetic circuit, if a storage capacity of the first memory used by the first arithmetic circuit is insufficient, reconfigure a third region of the programmable logic circuit as a second memory that supplements the storage capacity.

4. The information processing apparatus according to claim 3, wherein the processor is configured to, when the second region is reconfigured as the first arithmetic circuit, reconfigure a fourth region of the programmable logic circuit as a control circuit that controls access from the first arithmetic circuit to the first memory.

5. The information processing apparatus according to claim 4, wherein a distance between the fourth region and the first region is less than a distance between the second region and the first region.

6. The information processing apparatus according to claim 2, wherein the processor is configured to, when the second region is reconfigured as the first arithmetic circuit, reconfigure a fourth region of the programmable logic circuit as a control circuit that controls access from the first arithmetic circuit to the first memory.

7. The information processing apparatus according to claim 6, wherein a distance between the fourth region and the first region is less than a distance between the second region and the first region.

8. The information processing apparatus according to claim 2, wherein the processor is configured to:
when the second region is reconfigured as the first arithmetic circuit, if a storage capacity of the first memory used by the first arithmetic circuit is insufficient, reconfigure a third region of the programmable logic circuit as a second memory that supplements the storage capacity; and
reconfigure a fourth region of the programmable logic circuit as a control circuit that controls access from the first arithmetic circuit to each of the first memory and the second memory.

9. The information processing apparatus according to claim 8, wherein a distance between the fourth region and the first region is less than a distance between the second region and the first region.

10. The information processing apparatus according to claim 1, wherein the processor is configured to, when the second region is reconfigured as the first arithmetic circuit, if a storage capacity of the first memory used by the first arithmetic circuit is insufficient, reconfigure a third region of the programmable logic circuit as a second memory that supplements the storage capacity.

11. The information processing apparatus according to claim 10, wherein the processor is configured to, when the second region is reconfigured as the first arithmetic circuit, reconfigure a fourth region of the programmable logic circuit as a control circuit that controls access from the first arithmetic circuit to the first memory.

12. The information processing apparatus according to claim 11, wherein a distance between the fourth region and the first region is less than a distance between the second region and the first region.

13. The information processing apparatus according to claim 1, wherein the processor is configured to, when the second region is reconfigured as the first arithmetic circuit, reconfigure a fourth region of the programmable logic circuit as a control circuit that controls access from the first arithmetic circuit to the first memory.

14. The information processing apparatus according to claim 13, wherein a distance between the fourth region and the first region is less than a distance between the second region and the first region.

15. The information processing apparatus according to claim 14, wherein the fourth region is adjacent to the first region.

16. The information processing apparatus according to claim 1, wherein the processor is configured to:
when the second region is reconfigured as the first arithmetic circuit, if a storage capacity of the first memory used by the first arithmetic circuit is insufficient, reconfigure a third region of the programmable logic circuit as a second memory that supplements the storage capacity; and
reconfigure a fourth region of the programmable logic circuit as a control circuit that controls access from the first arithmetic circuit to each of the first memory and the second memory.

17. The information processing apparatus according to claim 16, wherein a distance between the fourth region and the first region is less than a distance between the second region and the first region.

18. The information processing apparatus according to claim 1, wherein:
the programmable logic circuit includes a plurality of logic blocks arranged in a grid pattern, and
the second region is rectangular.

19. The information processing apparatus according to claim 18, wherein the first region has a predetermined unified width.

20. A non-transitory computer readable medium storing a program causing a computer including a processor connected to a programmable logic circuit to execute a process, the process comprising:
upon initialization, reconfiguring a first region of the programmable logic circuit as a first memory that stores data;
reconfiguring a second region different from the first region of the programmable logic circuit as a first arithmetic circuit that uses the first memory; and
in a case where the second region reconfigured as the first arithmetic circuit is reconfigured as a second arithmetic circuit different from the first arithmetic circuit, allowing the second arithmetic circuit to use the first memory.

* * * * *